United States Patent [19]

Montesano

[11] Patent Number: 5,111,359
[45] Date of Patent: May 5, 1992

[54] HEAT TRANSFER DEVICE AND METHOD
[75] Inventor: Mark J. Montesano, Fairfax, Va.
[73] Assignee: E-Systems Inc., Dallas, Tex.
[21] Appl. No.: 686,604
[22] Filed: Apr. 17, 1991
[51] Int. Cl.⁵ .............................................. H05K 7/20
[52] U.S. Cl. .................... 361/388; 165/80.2; 165/185
[58] Field of Search ............................... 361/386–389; 165/185, 80.2, 80.3; 357/81

[56] References Cited

U.S. PATENT DOCUMENTS

| | | | |
|---|---|---|---|
| 4,849,858 | 7/1989 | Grapes et al. | 361/388 |
| 4,867,235 | 9/1989 | Grapes et al. | 361/388 |

*Primary Examiner*—Gregory D. Thompson

[57] ABSTRACT

A heat transfer device and method may be used to conduct heat from a heat source to a heat sink. The device and method improved thermal conduction in composite material mounting boards for heat generating components. The composite material fibers in the core of the board may be parallel to the mounting surface of the core throughout their length. The device may include at least two thermally conductive wedges embedded in the core for conducting heat into and out of the interior of the core. The wedges may be milled metal that may be mechanically and/or thermally attached to the composite material. The wedges may also be chemically plated to the composite. A plurality of the fibers contact both wedges to conduct heat to a surface adapted to transfer heat to the sink. A method of manufacture of the device provides that cavities for the wedges may be milled in the composite material of the core.

13 Claims, 3 Drawing Sheets

HEAT TRANSFER DEVICE AND METHOD

BACKGROUND OF THE INVENTION

The present invention relates to a heat transfer device, a method of transferring heat and a method of manufacture of a heat transfer device. More particularly, the present invention relates to a device and method for transferring heat from a heat source to a heat sink through thermally conductive fibers in a composite material.

The conduction of heat away from heat generating components has long been a problem, particularly where the components are adversely affected by an increase in temperature. This problem is often exacerbated in electronic systems where such components are frequently grouped in close proximity on mounting boards. (The term "component(s)" refers to both a single component and component assemblies of more than one component.) One solution to this problem has been to use the mounting boards to conduct heat away from the components to a remote heat sink. In some applications, such as in airborne electronic systems, it is particularly desirable to use lightweight mounting boards and composite materials have been developed that are suitable for use in lightweight boards for airborne systems.

Composite boards of materials such as carbon pitch fiber may comprise a core of binder material and fibers that are highly thermally conductive. Typically, the fibers in the core are arrayed in rows in parallel layers and held together by the binder. The core may contain a significant amount of binder by volume, typically at least 35%. It has been found that the fibers may be three times more thermally conductive than copper. However, the binder is frequently a poor thermal conductor and the fibers themselves are the only significant conduit for the thermal energy. As a result, carbon pitch fiber composite boards have poor thermal conductivity in the direction transverse to the layers of the fibers, and high thermal conductivity through the fibers along the layers.

The problem presented by the poor thermal conductivity transverse to the fibers may be more easily seen with reference to FIGS. 1–3. With reference to the typical installation of FIG. 1, a mounting board 10 may be carried in a rack 20 designed to carry several of the boards and having heat sinks 30 located thereon. When the board is mounted in the rack, heat from the heat source mounted on the mounting surface is conducted through a core 12 to the heat sink 30. Typically, the board is mounted in the rack so that contact is continuously maintained between the core and the sink and, to this end, may be held in the rack with a pressure fitting 32. Because it is important to maintain contact between the ends 14 of the core 12 and the sink 30, a portion 16 of the mounting surface of the core adjacent its ends is generally brought into pressural engagement with the sink 30. Accordingly, and with reference to FIG. 2 where the direction of heat transfer is shown by the arrows, heat from the heat source is transferred from one portion of the mounting surface of the core 12 to another portion of the mounting surface and to the heat sink.

As shown in FIG. 2, the board may have a core 12 formed from a single piece of thermally conductive and isotropic material. The heat can be conducted vertically into the core (direction A in FIG. 2) and the entire cross-sectional area of the core may be used to conduct the heat from the source to the sink. However, the materials of choice for the core 12, aluminum and copper, have significant performance limitations. For example, copper has high thermal conductivity, but also has a high density that limits its use in airborne applications. Aluminum has low density, but also has low thermal conductivity.

When, with reference to FIG. 3, high conductivity fiber composite materials are used in an effort to improve thermal conductivity and reduce weight, the heat is not readily conducted transverse to the layers of the fibers vertically into the core 18 and is generally confined to the mounting surface of the core 18. Because of the reduction in cross-sectional areas of the core effectively conducting heat, the composite board is unable to conduct the heat away from the components as efficiently as the solid boards. Further, the resulting thermal conductivity is significantly less than the array of fibers could potentially achieve.

One known approach to increasing the efficiency of thermal conduction in a composite mounting board is to expose the ends of the fibers in the core to the heat source and the heat sink. With reference to FIG. 4, this may be accomplished by bending the fibers 40 so that their ends reach the mounting surface of the core. The source of heat may be positioned proximate one end 42 of the bent fibers and a heat sink positioned proximate the other end 44 of those fibers. As shown, for example, in U.S. Pat. Nos. 4,867,235 and 4,849,858 to Grapes, et al. it is known to place an insert 46 inside the composite material to help achieve the necessary fiber bending. Bending the fibers and using an insert may, however, introduce complexities to the manufacturing process and may weaken the strength of the board.

A further problem with the bending of the fibers may be more clearly seen with reference to FIG. 5. The ends 42 of the bent fibers form specific area(s) 48 for heat transfer whose location cannot be changed once the board has been manufactured. In order to effect heat transfer, the heat generating components must be placed proximate the specific areas 48. Consequently, boards must be designed and manufactured for each layout of heat generating components. If large numbers of the fibers are bent to create a large heat transfer area in an effort to overcome this problem, the strength of the board may be unacceptably compromised. As a result, a generic composite board has not heretofore been produced that could be adapted to transfer heat from areas throughout the board's lateral surface.

It also is to be understood that in such composite mounting boards, heat from the components may be transferred to only those fibers whose ends reach the mounting surface adjacent the component. Fibers whose ends reach the mounting surface remote from the component do not have heat conducted thereto, although some radiated heat may reach remote fibers ends.

Accordingly, objectives of the present invention are to provide a novel heat transfer device that may be used as a mounting board for heat generating components, a method of transferring heat and a method of manufacturing a heat transfer device that reduce the problems of the prior art and improve the efficiency of heat conduction in composite mounting boards.

It is a further object of the present invention to provide a novel heat transfer device having a core of thermally conductive fibers that are parallel to the mounting surface of the core throughout their length.

It is yet a further object of the present invention to provide a novel heat transfer device that includes heat conducting means for conducting heat into the depth of the core of the device.

It is still a further object of the present invention to provide a novel heat transfer device formed from a composite material having a core of thermally conductive fibers in which heat is conveyed to the interior of the core without bending the fibers.

It is another object of the present invention to provide a novel method of manufacturing a heat transfer device having a core of composite materials in which wedges are placed in cavities in the core for conducting heat to and from fibers in the interior of the core.

It is yet another object of the present invention to provide a novel method of manufacturing a heat transfer device that may be adapted to transfer heat from selected areas on the board's mounting surface after the core of the board has been formed.

It is still another object of the present invention to provide a novel method for transferring heat from a heat source to a heat sink in which heat is conducted through fibers in the interior of a core of composite material.

These and many other objects and advantages will be readily apparent to one skilled in the art to which the invention pertains from a perusal of the claims, the appended drawings, and the following detailed description of preferred embodiments.

THE DRAWINGS

DETAILED DESCRIPTION OF PREFERRED EMBODIMENTS

Figure 1:
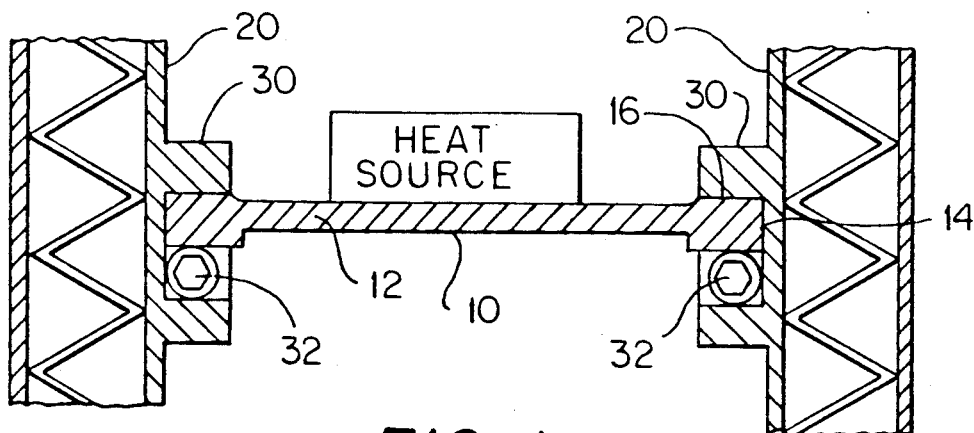
FIG. 1 is a partial pictorial representation of a vertical cross-section of a typical installation for a heat transfer device of the prior art.
Figure 2:
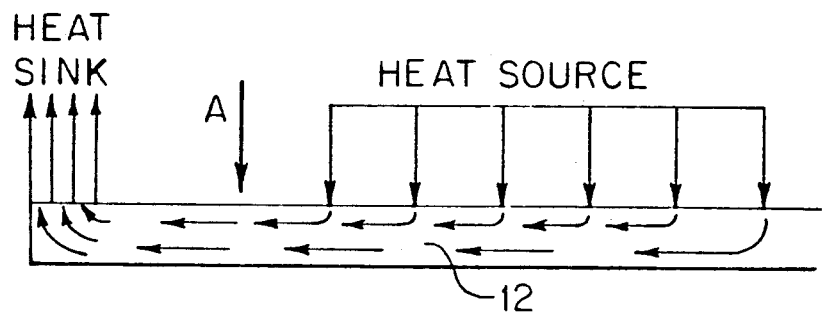
FIG. 2 is a partial pictorial representation in vertical cross-section of a solid heat transfer device of the prior art depicting the direction of heat flow.
Figure 3:
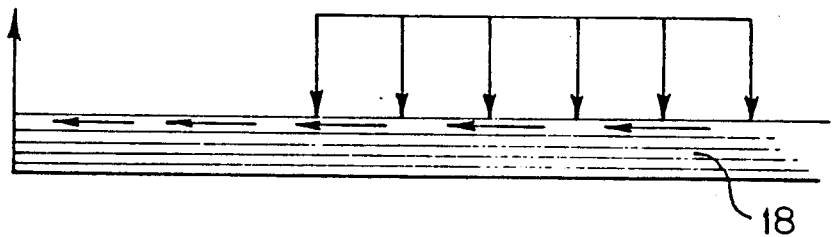
FIG. 3 is a partial pictorial representation in vertical cross-section of a composite heat transfer device of the prior art depicting the direction of heat flow.
Figure 4:
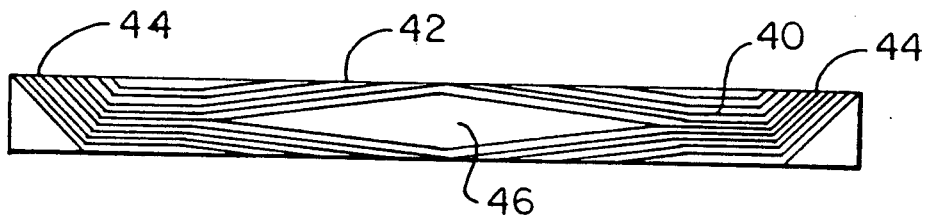
FIG. 4 is a partial pictorial representation in vertical cross-section of a heat transfer device of the prior art illustrating the bending of the fibers within the core.
Figure 5:
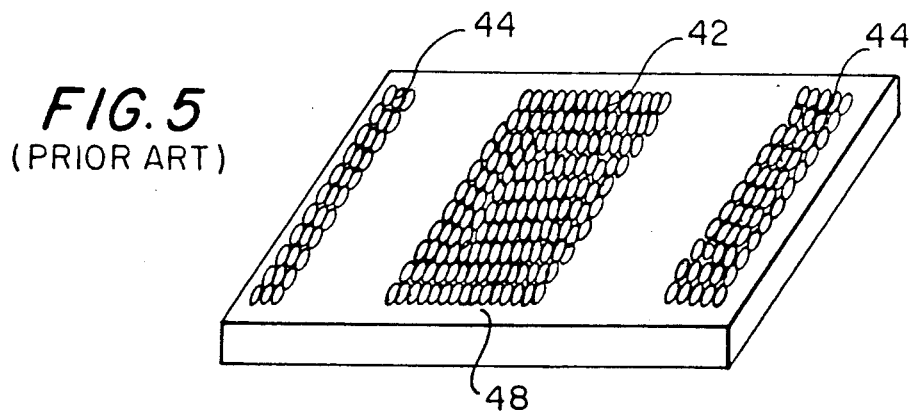
FIG. 5 is perspective view of a pictorial representation of a prior art mounting board illustrating the surface areas for transferring heat.
Figure 6:
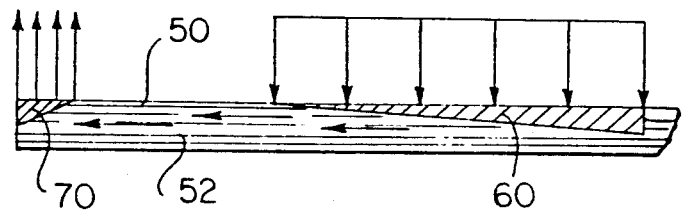
FIG. 6 is a partial pictorial representation in vertical cross-section of a first embodiment of the present invention.

With reference now to FIG. 6, the present invention may include a core 50 for conducting heat from a heat source to a heat sink. Such a core may be used in a mounting board for heat generating electronic components and may comprise a composite material having thermally conductive fibers 52 arrayed generally parallel to a mounting surface of the core throughout their length. A first wedge 60 of thermally conductive material may be positioned in the core 50 in an area in which heat generating components may be mounted. A second wedge 70 may be placed in the core 50 in an area in which heat may be transferred to a heat sink. The wedges 60 and 70 may be positioned so that one end of a multiplicity of the fibers 52 in the core 50 contact the first wedge 60 and the other end of those fibers contact the second wedge 70. When a heat source is positioned near the first wedge 60, heat transferred therefrom may be conducted vertically to the fibers 52 in the core by the first wedge. The heat may then be conducted through the fibers 52 to second wedge 70 that may be positioned near the heat sink. The heat may be conducted vertically by the second wedge 70 from the fibers in the core to a surface adapted to transfer heat to the heat sink. The surface adapted to transfer heat to the heat sink may be a portion of the mounting surface or another portion of the board, such as the surface opposite the mounting surface.

Figure 7:
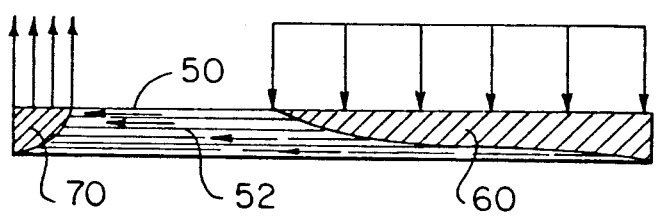
FIG. 7 is a partial pictorial representation in vertical cross-section of a second embodiment of the present invention.
Figure 8:
FIG. 8 is a partial pictorial representation in vertical cross-section of a third embodiment of the present invention.
Figure 9:
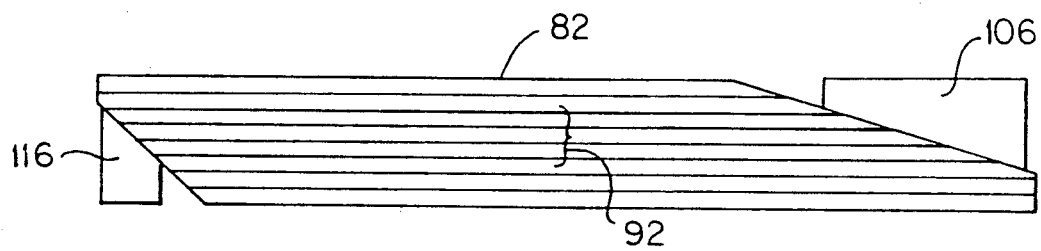
FIG. 9 is a partial pictorial representation in vertical cross-section of a fourth embodiment of the present invention.
Figure 10:
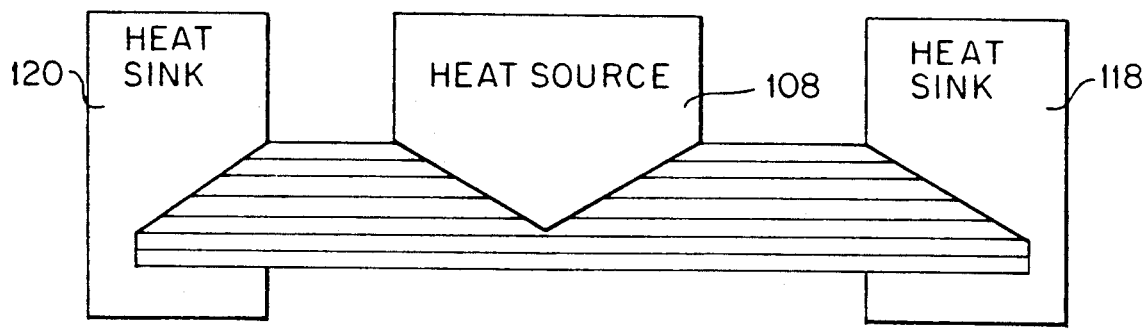
FIG. 10 is a partial pictorial representation in vertical cross-section of a fifth embodiment of the present invention.

The term "wedge" as used herein includes, without limitation, any appropriately shaped means for conducting heat vertically into and out of the core and for making contact with the ends of some of the fibers contained therein. For example, the wedge as seen in cross-section may be triangularly shaped as seen in FIG. 6, a conic section as seen in FIG. 7, or trapezoidal in shape such as seen in FIGS. 8 and 9. In addition, the wedge at the end of the board adjacent the heat sink may be integral with and a part of the heat sink as seen in FIG. 10.

Figure 11:
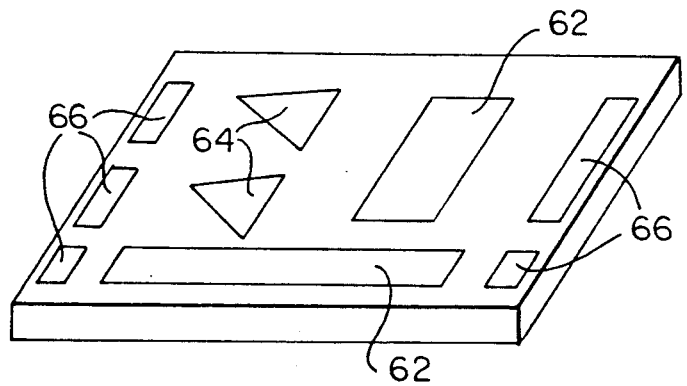
FIG. 11 is a perspective view of a pictorial representation of an embodiment of the present invention illustrating alternative arrangements for the thermally conductive wedges.

The lateral extent of the wedges and their position on the surfaces of the core may be varied to correspond to the particular layout of heat generating components. For example, and with reference to FIG. 11, a wedge 62 may be located in the proximity of a group of components or plural wedges 64 may be used in association with plural components. Second wedges 66 may be appropriately positioned proximate the heat sink and in contact with the fibers conducting heat from the wedges 62 and 64.

The depth to which the wedges extend into the core and their three-dimensional shape (e.g., pyramidal) may vary depending on such factors as the amount of heat to be conducted, the weight of the board and/or its requisite strength. The wedge may extend partially into the board as seen in FIG. 6 or may extend all or substantially all the way to the opposite surface as seen in FIG. 7.

The wedges may be formed from any appropriate thermally conductive material such as aluminum and may have a surface flush with the surface of the board, or extend above or below the surface as appropriate to cooperate with the mounting of heat generating components thereon and with the mating to the heat sink.

The term "contact" as used herein to indicate the thermal conducting relationship of the wedge and the fibers includes, without limitation, physical contact, a gap sufficiently small to allow thermal conduction, and/or a gap filled with a thermally conductive material suitable for the transfer of heat from the fibers to the wedge or from the wedge to the fibers.

Heat may be transferred from the components to the first wedge and from the second wedge to the heat sink in an appropriate manner, such as conduction, convection or radiation. In contrast to the prior art, heat from the components may be conducted through the wedge to all of the fibers contacting the wedge, not to just those fibers adjacent the components.

In manufacture, the core of composite material may be constructed of layers of fibers, with each layer having plural rows of fibers. The fibers may be any appropriate thermally conductive fibers used in composite materials such as carbon fibers. When the fibers are formed into the composite material, a binder material such as epoxy may be used. The core may be manufactured without regard to the layout of components with which it may eventually be used.

When the location of the components has been determined, the positions for the wedges may be selected in consideration of such factors as the amount of heat to be transferred and the weight and/or requisite strength of the board. Cavities in the core for the wedges and may be formed by any appropriate process such as milling. A thermal grease may be used between the wedge and the fiber ends in the cavity to minimize boundary resistance to thermal conduction. The wedges may also be chemically plated to the board using printed wiring board technologies. When the desired thickness of plating is achieved, the board may be ground flat to a desired thickness.

With reference now to FIGS. 8-10 and 12, various alternative embodiments of the present invention may be appropriate for specific applications. In the event that the heat source produces more heat in a particular area, several wedges having different thermal conduction properties may be used. As seen in FIG. 8, two wedges 102 and 104 having different thermal conduction properties may be used to conduct heat into the core. Correspondingly constituted wedges 112 and 114 may be used at the heat sink. With reference now to FIG. 9, the heat source and the heat sink may be on opposite surfaces of the core 82. The wedges 106 and 116 may be positioned so that the ends of a group of fibers 92 may be in contact with both wedges 106 and 116. As seen in FIG. 10, wedges 118 and 120 may be used in the event that one heat sink does not provide sufficient thermal transfer.

In another alternative embodiment as seen in FIG. 10, the heat source (e.g., an electronic component) may be attached to or be part of the first wedge 108 for conducting heat to the fibers. As further illustrated in FIG. 10, a wedge 118 may be a heat sink which may be adapted to hold the core.

Figure 12:
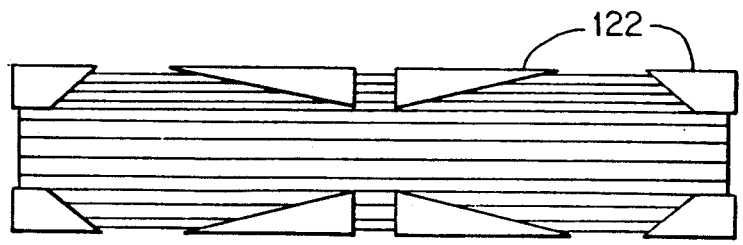
FIG. 12 is a partial pictorial representation in vertical cross-section of a sixth embodiment of the present invention.

In a further alternative embodiment as seen in FIG. 12, wedges 122 may also be positioned on both sides of the board. Such an arrangement may be useful in event heat generating components are located on both sides of the board.

While preferred embodiments of the present invention have been described, it is understood that the embodiments described are illustrative and that the scope of the invention is to be defined solely by the appended claims when accorded a full range of equivalence, many variations and modifications naturally occurring to those skilled in the art from a perusal thereof.

I claim:

1. A lightweight electronic component mounting board suitable for use in an airborne environment comprising:
   (1) a generally flat core adapted to receive an electronic component in a heat transfer relationship to a mounting surface, said core (a) having a depth relatively small when compared to the length and width thereof and (b) being comprised of heat conducting fibers in a binder, said conducting fibers being disposed generally parallel to said mounting surface with their longitudinal axis generally parallel to the length of said core;
   (2) a first wedge carried by said core and adapted to be in a heat transfer relationship to a heat generating electronic component when such component is mounted on said board, said first wedge extending into the depth of said core in a heat transfer relationship with said conducting fibers embedded therein; and
   (3) a second wedge carried by said core adjacent one longitudinal end thereof, said second wedge (a) being adapted to transfer heat to a heat sink (b) extending cross the width of said core a distance substantially the same as the width of said first wedge, (c) extending into the depth of said core a distance substantially the same as the depth of said first wedge, and (d) being in a heat transfer relationship with said conducting fibers embedded therein,
   whereby heat generated by a component mounted on said board may be conducted by said first wedge into the depth of said core into contact with said conducting fibers therein and to said second wedge for transfer to a heat sink.

2. The electronic component mounting board of claim 1 including a third wedge at the other longitudinal end of said core, said third wedge (a) being adapted to transfer heat to a heat sink, (b) extending across the width of said board a distance substantially the same as the width of said first wedge and (c) extending into the depth of said core a distance substantially the same as the depth of said first wedge, and (d) being in a heat transfer relationship with said conducting fibers embedded therein,
   whereby heat generated by a component mounted on said board may be conducted by said first wedge into said conducting depth of said core into contact with the fibers therein and to said third wedge for transfer to a heat sink.

3. The board as defined in claim 1 wherein said second wedge comprises a heat sink and is adapted to hold said core.

4. In a board having a surface for mounting a heat generating electronic component, the board comprising a plurality of elongated heat conducting fibers disposed in a substantially parallel relationship to each other within a binder, the improvement comprising:
   (a) first heat conducting means embedded in said board intermediate the ends thereof for conducting heat from the mounting surface of said board into the depth of said board to said fibers within the interior thereof; and
   (b) second heat conducting means embedded in said board adjacent one end thereof for conducting heat from said fibers in the interior thereof to an exterior surface of the board for transfer to a heat sink.

5. The improved board as defined in claim 4 wherein said first heat conducting means is generally triangularly shaped when viewed in vertical cross-section, said triangularly shaped first means having one side generally parallel to the mounting surface of said board and an apex extending into the depth of said board.

6. The improved board as defined in claim 4 wherein each of said first and second heat conducting means comprises plural wedges.

7. A composite mounting board for transferring heat from a first portion of a surface thereof to a second portion of the surface, the board comprising:
   (a) a core comprising heat conducting fibers arrayed longitudinally generally parallel to the surface;
   (b) a first wedge in the surface for conducting heat from said first portion of the surface to said fibers internally of said core; and
   (c) a second wedge in the surface for conducting heat from said fibers to said second portion of the surface.

8. In the method of conducting heat from a heat generating electronic component mounted on a composite mounting board having heat conducting fibers internally of the board in a binder and a heat conducting means for transferring heat to a heat sink spaced from such components, which heat conducting fibers are not disposed in an effective heat conducting relationship because of their depth within the board and the heat conducting characteristics of the binder, the improvement comprising the steps of:
   (a) providing a heat conducting mount for an electronic component;
   (b) embedding a portion of said mount internally of said board to thereby contact said conducting fibers internally of the board so that heat from said component may be conducted thereto; and
   (c) embedding a portion of said heat conducting means internally of said board to thereby contact said fibers internally of said board so that heat from said fibers internally of the board may be conducted to said heat conducting means.

9. A method of transferring heat from a heat source mounted on a mounting surface of a core of thermally conductive fibers to a heat sink remote from the heat source comprising the steps of:
   (a) transferring heat from a heat source to a first heat conduction means in said core;
   (b) conducting heat from said first heat conduction means to a plurality of said fibers internally of said core and sufficiently spaced apart from said mounting surface so as to be out of an effective heat transfer relationship therewith;
   (c) conducting heat through said fibers to a second heat conduction means in said core; and
   (d) transferring heat from said second heat conduction means to a heat sink.

10. A method of transferring heat from a heat source mounted on a mounting surface of a core of thermally conductive fibers to a heat sink remote from the heat source comprising the steps of:
   (a) transferring heat from a heat source to a first heat conduction means in said core;
   (b) conducting heat through said first heat conduction means to a plurality of said fibers sufficiently spaced apart laterally from the heat source so as to be out of an effective heat transfer relationship therewith;
   (c) conducting heat through said fibers to a second heat conduction means in said core; and
   (d) transferring heat from said second heat conduction means to a heat sink.

11. A method of transferring heat in a rack for lightweight electronic component mounting boards suitable for use in an airborne environment comprising the steps of:
   (1) providing plural heat sinks on the rack, each of the heat sinks being adapted to receive one of the mounting boards;
   (2) providing each of the mounting boards with a generally flat core adapted to receive an electronic component in a heat transfer relationship to a mounting surface thereof, said core (a) having a depth relatively small when compared to the length and width thereof and (b) being comprised of heat conducting fibers in a binder, said conducting fibers being generally disposed generally parallel to said mounting surface with their longitudinal axis generally parallel to the length of said core;
   (2) embedding a first wedge in said core in a heat transfer relationship to a heat generating electronic component when such component is mounted on said board, said first wedge extending into the depth of said core in a heat transfer relationship with said conducting fibers embedded therein; and
   (3) embedding a second wedge in said core adjacent a longitudinal end thereof, said second wedge (a) being adapted to transfer heat to one of the heat sinks, (b) extending across the width of said core a distance substantially the same as the width of said first wedge, (c) extending into the depth of said core a distance substantially the same as the depth of said first wedge, and (d) being in a heat transfer relationship with said conducting fibers embedded therein,
   whereby heat generated by a component mounted on said core may be conducted by said first wedge into the depth of said core into contact with said conducting fibers therein and to said second wedge for transfer to the heat sink.

12. A method of manufacturing a heat transfer device for transferring heat from a heat source to a heat sink, comprising the steps of:
   (a) forming a core of generally parallel thermally conductive fibers;
   (b) creating a first cavity in a surface of said core that is adapted to face a heat source;
   (c) positioning first conduction means in said first cavity so that said first conduction means contacts a plurality of said fibers internally of said core;
   (d) creating a second cavity in a surface of said core that is adapted to face a heat sink; and
   (e) positioning second conduction means in said second cavity so that said second conduction means contacts said plurality of fibers.

13. A method of manufacturing a heat transfer device for transferring heat from a heat source to a heat sink, comprising the steps of:
   (a) forming a core of generally parallel thermally conductive fibers;
   (b) creating a first cavity in a surface of said core that is adapted to face a heat source;
   (c) creating a second cavity in a surface of said core that is adapted to face a heat sink; and
   (d) chemically plating conduction means in said first and second cavities so that said conduction means contacts said plurality of fibers.

* * * * *